(12) United States Patent
Singhal et al.

(10) Patent No.: US 7,002,494 B2
(45) Date of Patent: *Feb. 21, 2006

(54) LOW MEMORY AND MIPS EFFICIENT TECHNIQUE FOR DECODING HUFFMAN CODES USING MULTI-STAGE, MULTI-BITS LOOKUP AT DIFFERENT LEVELS

(75) Inventors: Manoj Singhal, Karnataka (IN); Sandeep Bhatia, Karnataka (IN); Srinivasa Mpr, Karnataka (IN)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/996,159

(22) Filed: Nov. 23, 2004

(65) Prior Publication Data

US 2005/0099326 A1    May 12, 2005

Related U.S. Application Data

(63) Continuation of application No. 10/706,169, filed on Nov. 12, 2003, now Pat. No. 6,839,005.

(60) Provisional application No. 60/518,095, filed on Nov. 7, 2003.

(51) Int. Cl.
*H03M 7/00* (2006.01)

(52) U.S. Cl. .......................................... 341/79; 341/67

(58) Field of Classification Search ................. 341/50, 341/65, 67, 79
See application file for complete search history.

(56) References Cited

U.S. PATENT DOCUMENTS

| | | | | |
|---|---|---|---|---|
| 3,918,047 A | * | 11/1975 | Denes | |
| 4,990,910 A | * | 2/1991 | Takishima et al. | 341/67 |
| 5,396,625 A | * | 3/1995 | Parkes | 707/1 |
| 5,534,861 A | * | 7/1996 | Chang et al. | 341/79 |
| 5,541,595 A | * | 7/1996 | Meyer | 341/67 |
| 5,550,542 A | * | 8/1996 | Inoue | |
| 5,696,507 A | * | 12/1997 | Nam | |
| 5,752,243 A | * | 5/1998 | Reiter et al. | |
| 5,801,648 A | * | 9/1998 | Satoh et al. | |
| 5,982,306 A | * | 11/1999 | Nam | 341/67 |
| 6,535,150 B1 | * | 3/2003 | Ross | |
| 6,621,429 B1 | * | 9/2003 | Tsuchido et al. | |
| 6,741,191 B1 | * | 5/2004 | Jang et al. | |

OTHER PUBLICATIONS

U.S. Appl. No. 10/706,169, entitled "Low Memory and MIPS Efficient Technique For Decoding Huffman Codes Using Multi-Stage, Multi-Bits Lookup at Different Levels", filed Nov. 23, 2004, Singhal, et al.*

* cited by examiner

*Primary Examiner*—Linh Van Nguyen
(74) *Attorney, Agent, or Firm*—McAndrews, Held & Malloy, Ltd.

(57) ABSTRACT

Present herein is a low memory and MIPS efficient technique for decoding Huffman codes using multi-stage, multi-bits lookup at different levels. A binary tree is cut at levels depending on the quotient of the number of existing nodes and the number of possible nodes.

18 Claims, 8 Drawing Sheets

| Data Symbols | A | B | C | D | E | F | G | H | I | J | K | L |
|---|---|---|---|---|---|---|---|---|---|---|---|---|
| Huffman Codes | 00 | 010 | 100 | 101 | 110 | 0110 | 0111 | 1100 | 1101 | 1110 | 11110 | 111111 |

FIG. 1

LOW MEMORY AND MIPS EFFICIENT TECHNIQUE FOR DECODING HUFFMAN CODES USING MULTI-STAGE, MULTI-BITS LOOKUP AT DIFFERENT LEVELS

RELATED APPLICATIONS

This application is a continuation of and claims priority to U.S. patent Ser. No. 10/706,169, entitled "LOW MEMORY AND MIPS EFFICIENT TECHNIQUE FOR DECODING HUFFMAN CODES USING MULTI-STAGE, MULTI-BITS LOOKUP AT DIFFERENT LEVELS", by Singhal et al., filed Nov. 12, 2003, issued as U.S. Pat. No. 6,839,005, which claims the priority benefit of U.S. Provisional Patent Application Ser. No. 60/518,095, entitled "LOW MEMORY AND MIPS EFFICIENT TECHNIQUE FOR DECODING HUFFMAN CODES USING MULTI-STAGE, MULTI-BITS LOOKUP AT DIFFERENT LEVELS", filed Nov. 7, 2003, by Singhal, which are incorporated herein by reference.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Huffman coding is a loss-less compression technique often used in lossy compression schemes as the final step after decomposition and quantization of a signal. Huffman coding uses unique variable length code words and no Huffman code is a prefix of another Huffman code. For a given probability density function of a symbol set, shorter codes can be assigned to frequently occurring symbols while longer codes can be assigned to less frequently occurring symbols. Huffman's minimum redundancy encoding minimizes the average number of bits required to represent the data and is one type of variable length coding.

Huffman coding is useful for reduction of the bit-rate by exploring statistical redundancies and to encode a "minimum set" of information using entropy-coding technique. Usually entropy coders exploit the symbol probabilities independent of the previous symbols, and hence are optimal for uncorrelated sequences.

The Huffman coding/decoding is one of the key components of an encoder/decoder in many of the audio/video compression standards. So there is a necessity of its implementation on the digital signal processor (DSP) for a cost effective solution. However, the architecture and instruction set of DSPs are optimized for computations with operands that are byte, half word or word size. Since the symbols have variable length after encoding, there is a necessity of extracting code words that are not necessarily byte, half word, or word size.

On the other hand, the memory access usually fetches data that are only byte, half word, or word aligned. Due to this, the speed of the Huffman Decoder implemented on DSP is lower than that of a corresponding implementation on dedicated hardware.

In addition to this, most of the compression standards have multiple Huffman tables containing long code words that have to be stored on expensive on-chip memory for fast access. These two factors emphasize the importance of high speed and memory efficient implementation of Huffman decoding on the DSP. Though the DSP's architectures are optimized for for signal processing applications, they are not so in the case of search algorithms.

Given that Huffman encoding/decoding is a very important component of compression standards, it is important that the Huffman Encoder/Decoder should be efficiently implemented on the DSP chosen. The complexity of the Huffman decoder's implementation lies in fast search of the symbol encoded from the bit-stream without consuming large memory. These two requirements are conflicting and in addition, the standards have multiple tables of large code length.

Further limitations and disadvantages of conventional and traditional systems will become apparent to one of skill in the art through comparison of such systems with the invention as set forth in the remainder of the present application with reference to the drawings.

BRIEF SUMMARY OF THE INVENTION

Presented herein is a low memory and MIPS efficient technique for decoding Huffman codes using multi-stage, multi-bits lookup at different levels.

In one embodiment, there is a method for storing a variable length code table in a memory. The method comprises calculating a proportion for each level of a binary tree, the proportion for each level being the quotient of a number of nodes at each level of the binary tree and the number of possible nodes at each level of the binary tree, comparing the proportion for each level of the binary tree to a threshold value which is fine tuned depending upon the distribution of various Huffman codes at various levels in the binary tree and generating at least one new binary tree from at least one node at a particular level, if the threshold exceeds the proportion for a next level.

In another embodiment, there is an article of manufacture comprising a computer readable medium. The computer readable medium stores a plurality of instructions. Execution of the plurality of instructions causes calculating a proportion for each level of a binary tree, the proportion for each level being the quotient of a number of nodes at each level of the binary tree and the number of possible nodes at each level of the binary tree, comparing the proportion for each level of the binary tree to a threshold value, and generating at least one new binary tree from at least one node at a particular level, if the threshold exceeds the proportion for a next level.

These and other advantages and novel features of the present invention, as well as details of an illustrated embodiment thereof, will be more fully understood from the following description and drawings.

BRIEF DESCRIPTION OF SEVERAL VIEWS OF THE DRAWINGS

FIG. 1 is a block diagram describing an exemplary Huffman code;

DETAILED DESCRIPTION OF THE INVENTION

Referring now to FIG. 1, there is illustrated a block diagram describing an exemplary Huffman code. Huffman coding is a loss-less compression technique that uses unique variable length code words to encode different symbols. For a given probability density function Huffman uses unique variable length code words, such that no code is a prefix for another code.

The Huffman code comprises 12 data symbols A, B, ... L, along with corresponding Huffman codes. The 12 data symbols can be packed in various ways but each combination gives different memory requirements and requires a different number of lookups. In one way, the 12 data symbols can be packed in a total of 32 memory locations. The foregoing results in a minimum number of cycle overheads since all the Huffman codes would be decoded in a single lookup, itself. However, the foregoing results in a significant amount of memory wastage. The memory wastage becomes more apparent if very long Huffman codes with a maximum length of 19 are used, as in MPEG-2. Where Huffman codes with a maximum length of 19 are used, 500K ($2^{19}$) memory locations are used. As can be seen, the memory consumption increases exponentially. To reduce the memory consumption, each Huffman code can be decoded with a different number of lookups, depending upon the Huffman code length. So, large codewords take more cycles than shorter code words. However, the larger codewords occur less often than smaller codewords in a stream. Accordingly, the average number of cycles needed to decode all the Huffman codes is reasonably small, with respect to the total memory consumed to pack all the Huffman codes along with their data symbols and signal bits for all the spectral amplitudes in a given frame.

In the exemplary illustrated Huffman code, there are a different number of code words with different lengths. For example, there is one codeword with two bits, four with three bits, two with four bits, four with five bits, and two with six bits. A binary tree can be generated that contains all the Huffman codes.

Figure 2:
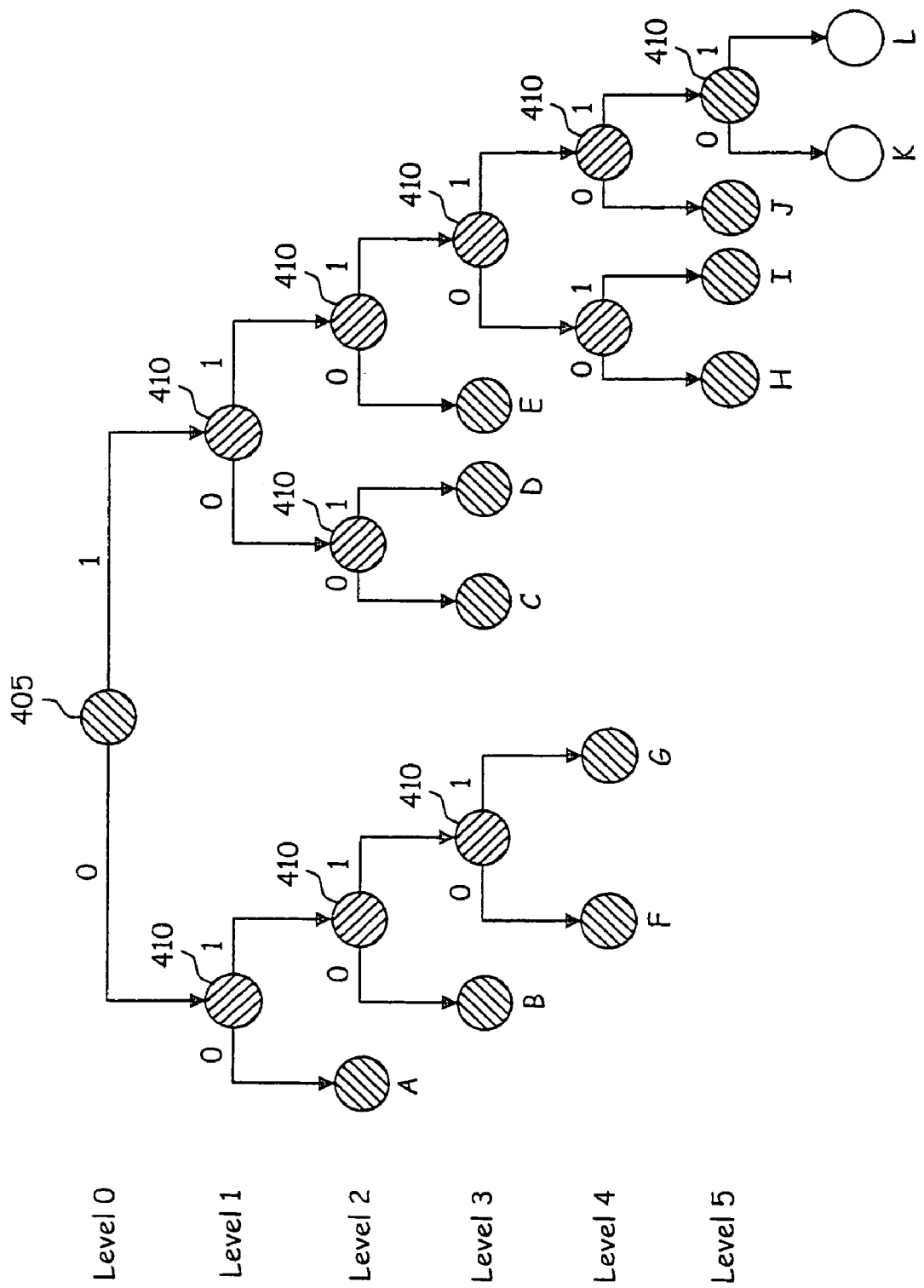
FIG. 2 is a block diagram of a binary tree for the Huffman code in FIG. 1.

Referring now to FIG. 2, there is illustrated an illustration of the binary tree for the Huffman code described in FIG. 1. The binary tree includes a root node 405, intermediate nodes 410, and all the Huffman codes, with the data symbols A, B, ... L, attached at the ends. However, the data symbols A, B, ... L traverse a variable number of total branches and each level has a different number of data symbols. For example, the data symbol A traverses a total of two branches, whereas the data symbol K and L traverse a total of six branches. Additionally, level 2 has one symbol, A, level 3 has four symbols, B, C, D, and E, level 4 has two symbols, F, and G, level 5 has four symbols, H, I, and J, and level 6 has two symbols, K and L.

Various combinations of memory consumption and cycles overhead are possible by cutting the root tree at different levels. Repeating the same procedure by cutting sub-trees (trees emerging from intermediate nodes 410) and keeping link addresses from the parent tree, it is possible to cut the child trees at different levels and keep doing so until all the Huffman codes are covered with a reasonable memory consumption and require a different number of lookups per Huffman code. The cut levels in the tree can be appropriately selected to pack all the Huffman codes and their corresponding data symbols in an efficient way, depending upon the memory requirements and cycles available.

To cut the levels in the tree, a proportion P is defined which is ratio of actual number of branches present up to that level to the total number of branches possible up to that level. To compute total branches possible up to any Nth level is $2*((2^N)-1)$. For example, at level 1 P(1)=1 (2/2), because there are two actual branches and maximum two possible branches. At level 2, P(2)=1 (6/6), because there are 6 actual branches and 6 ($2*((2^2)-1)$) maximum possible branches. For level 3, P(3)=0.8571 (12/14) because there are total 12 branches up to that level and there are 14 ($2*(2^3-1)$) maximum branches possible up to that level. For level 4, P(4)=0.5333 (16/30). For level 5, P(5)=0.3225 (20/62).

As can be seen, as the levels increase the proportion 'P' will decrease. A threshold T is selected, such that when the proportion P(N) falls below the threshold T, the tree is cut at level N. When a tree is cut at a level, N, each of the nodes at level N becomes the root of a new binary tree.

Additionally $2^N$ memory locations are associated with each of the possible N-bit combinations. Where a data path associated with an N-bit combination, leads to a symbol, the memory location associated with the N-bit combination stores the symbol. Where the data path associated with an N-bit combination leads to a new binary tree, the memory location associated with the N-bit combination stores a link to the new tree. For any N-bit combination that exceeds a codeword for a symbol, where the codeword matches a prefix of the N-bit combination, the memory location associated therewith indicates the foregoing and the symbol.

Figure 3:
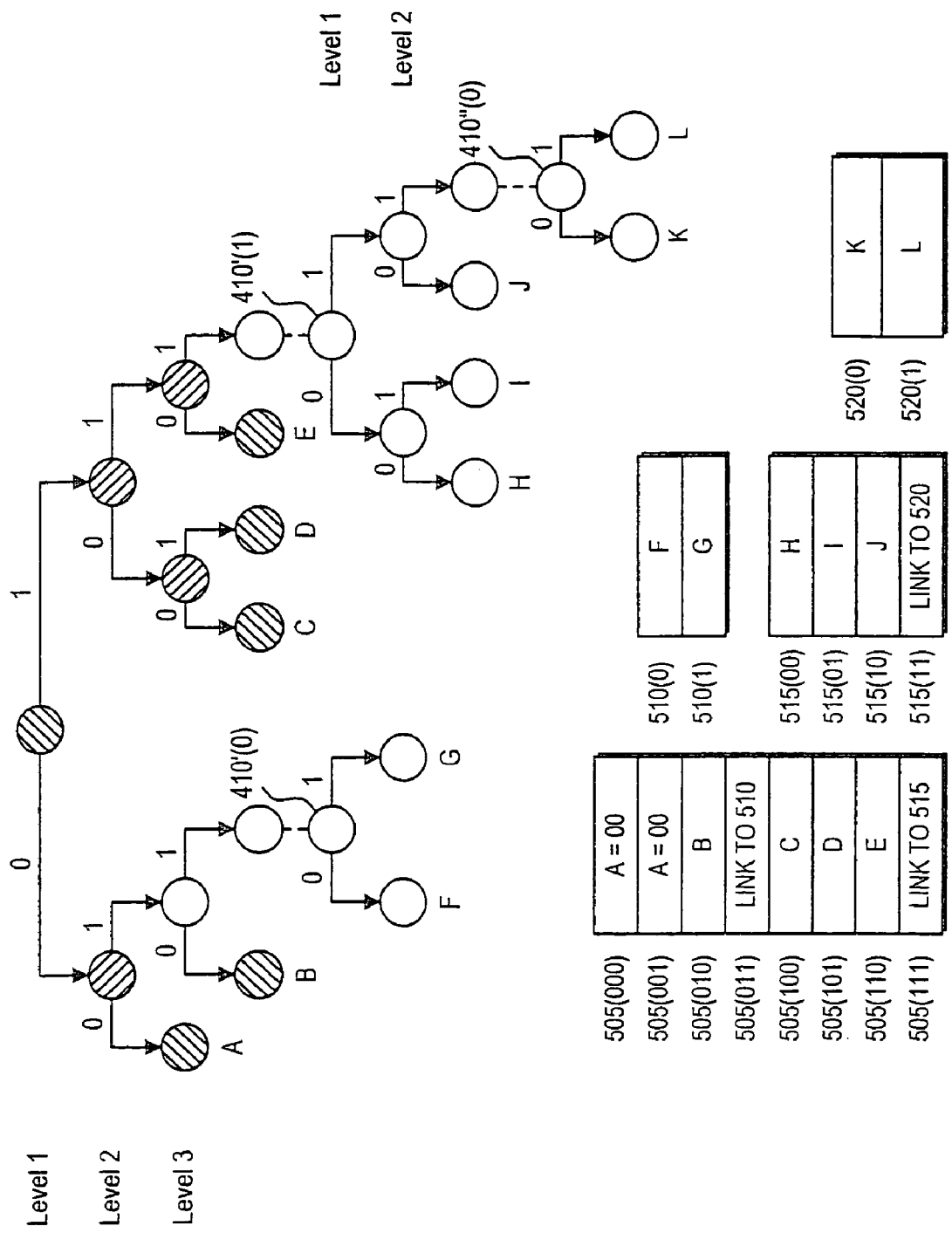
FIG. 3 is a block diagram describing the packing of the binary tree in accordance with an embodiment of the present invention.

Referring now to FIG. 3, there is illustrated a block diagram describing the binary tree of FIG. 2, packed into a memory in accordance with an embodiment of the present invention. The threshold T=0.58 is selected. As noted above, the P(3)=0.8571, and P(4)=0.5333. Accordingly, the tree is cut at level 4, resulting in new trees at root nodes 410(0)' and 410(1)'.

The value P is calculated for each level of the new trees at root nodes 410(0)' and 410(1)'. For the new tree at root node 410(0)', at level 1, P(1)=1, and at level 2, there are no branches. For the new tree at root node 410(1)', at level 1, P(1)=1 because there are two branches and two possible branches. At level 2, P(2)=1 because there are six branches and six possible branches. At level 3, P(3)=0.571. Accordingly, the tree at root node 410(1)' is cut at level 3, and a new tree emerges from a root at 410(0)".

The binary tree from root node 410, cut at level 3, is then packed into eight memory locations 505(000) ... 505(111). Each possible three bit combination is associated with a memory location 505(000) ... 505(111), where 505(*bbb*) is associated with the three bit combination bbb.

The data paths associated with the three-bit combinations, 010, 100, 101, and 110, result in symbols B, C, D, and E. Accordingly, memory locations 505(010), 505(100), 505(101), and 505(110) store the symbols B, C, D, and E, respectively. The data paths associated with the three-bit combinations, 011 and 111, lead to the new trees resulting at 410(0)', and 410(1)', respectively. Accordingly, memory locations 505(011) and 505(111) store a link to the new binary trees resulting at 410(0)' and 410(1)', respectively.

However, it is possible that some memory locations, e.g., 505(000) and 505(001), will be associated with three bit combinations that are not associated with a particular path. This is because certain data paths do not exist. Certain data paths do not exist where a codeword matches the prefix of the data path. For example, there are no data paths for 000 and 001. This is because the codeword 00, corresponding to symbol A, matches the prefix for 000 and 001. Accordingly, the memory locations 505(000) and 505(001) store an indicator that the codeword 00=A.

The tree at root node 410(0)' is packed into two memory locations, 510(0) and 510(1). Memory locations 505(0) and 505(1) store symbols C and D, respectively.

The tree at root node 410(1)' is packed into four memory locations, 515 (0), 515 (01), 515 (10), and 515 (11). The data paths associated with the two bit combinations 00, 01, and 10 result in symbols H, I, and J. Accordingly, memory locations 515(0), 515(01), and 515(10) store symbols H, I, and J, respectively. The data path associated with the two-bit combination 11, leads to the new binary tree at 410(0)". Accordingly, memory location 515(11) stores a link to table 520.

The tree at node 410(0)" is packed into two memory locations 520 (0) and 520 (1). Memory locations 520 (0) and 520(1) store symbols K and L, respectively.

Figure 4:
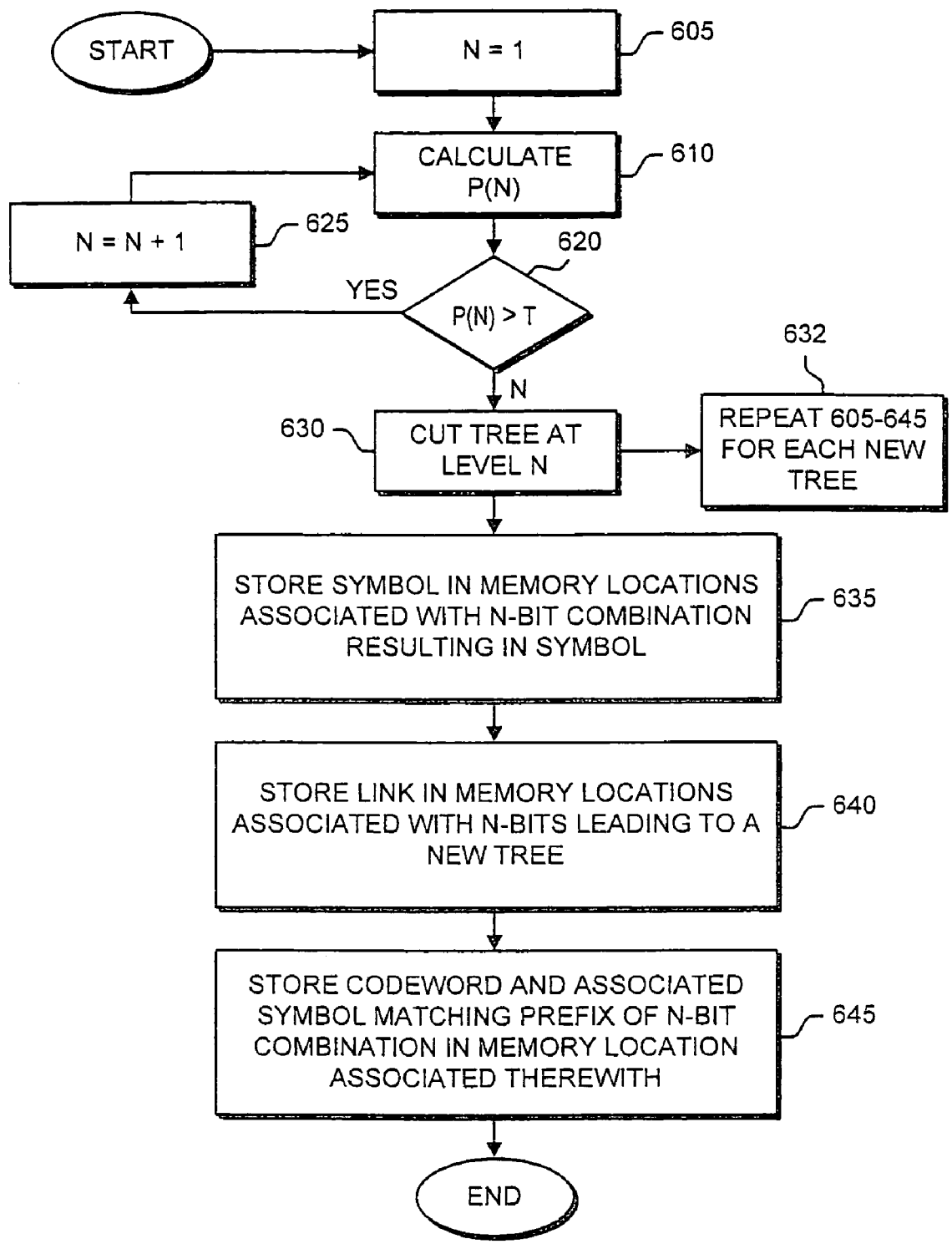
FIG. 4 is a flow diagram for packing a binary tree for a Huffman code in accordance with an embodiment of the present invention.

Referring now to FIG. 4, there is illustrated a flow diagram for packing a binary tree. At 605, a value N is set equal to 1, and a threshold T is selected. At 610, a proportion P of the total number of branches at level N divided by the total number of possible nodes at level N, $2*(2^N-1)$ is calculated for level N. If P>T at 620, then N=N+1 at 625, and 610–525 are repeated.

When the proportion P<T, the tree is cut at level N (630). When the tree is cut at level N, each node becomes the root of a new binary tree. For combinations of N-bits associated with data paths that lead to a symbol, a memory location is associated therewith, storing the symbol (635). For each N-bit combination associated with a data path that leads to a new binary tree, a memory location is associated therewith, storing a link to the new binary tree (640). For each N bit combination that is not associated with a data path, there is a codeword that matches the prefix of the N bits (645). Accordingly, the codeword and the symbol associated with the codeword that matches the prefix of the N bits are stored in each of the memory locations associated therewith. During 632, for each new binary tree that results from 630, 605–645 are recursively repeated.

Figure 5:
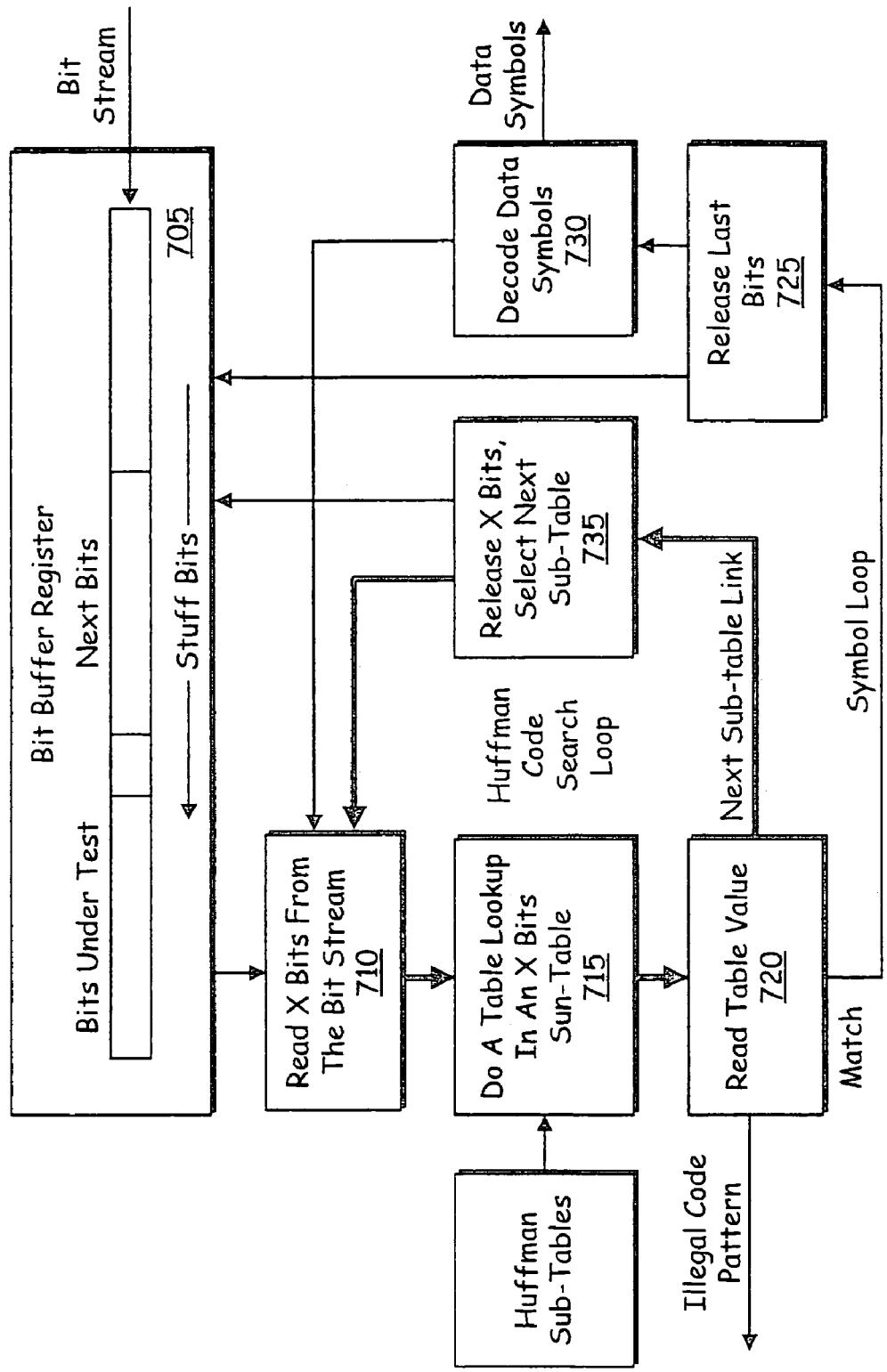
FIG. 5 is a flow diagram for decoding a Huffman code in accordance with an embodiment of the present invention.

Referring now to FIG. 5, there is illustrated a block diagram describing decoding a Huffman variable length code from memory in accordance with an embodiment of the present invention. The Huffman code tables are packed as described in FIG. 4.

At 705, a bit stream comprising variable length codes is read serially into a bit buffer register. At 710, a $n_i$ (where n is a variable) bits $X_i$ are read from the portion of the bit stream. The value of $n_i=\log_s$ (length of binary tree in iteration i). For example, in the case where the Huffman codes are as shown in FIG. 3, at the starting of decoding a new symbol, the first binary tree at node 410 has eight entries. Accordingly, n=3. At 715, the bits $X_i$ are used to address memory packing the binary tree. At 720, the contents of the memory location referenced by the bits $X_i$ are read to determine whether a codeword match has been found.

A match is determined if the first M bits of bits $X_i$ match that of an M-bit codeword. If a match occurs, the last N-M bits of bits $X_i$ are returned (725) to the bit buffer register and the decoded symbol is output (730).

If not match is found, but a link to another a memory storing another binary is found, the bit $X_i$ are released (735) and 710 is repeated. The foregoing is repeated until a symbol match is found. Alternatively, if the bits do not match with the bits of any codeword after $\Sigma n_i$ exceeds the number of bits in the maximum length code word. An error condition is declared and the bit register is cleared (740).

Figure 6:
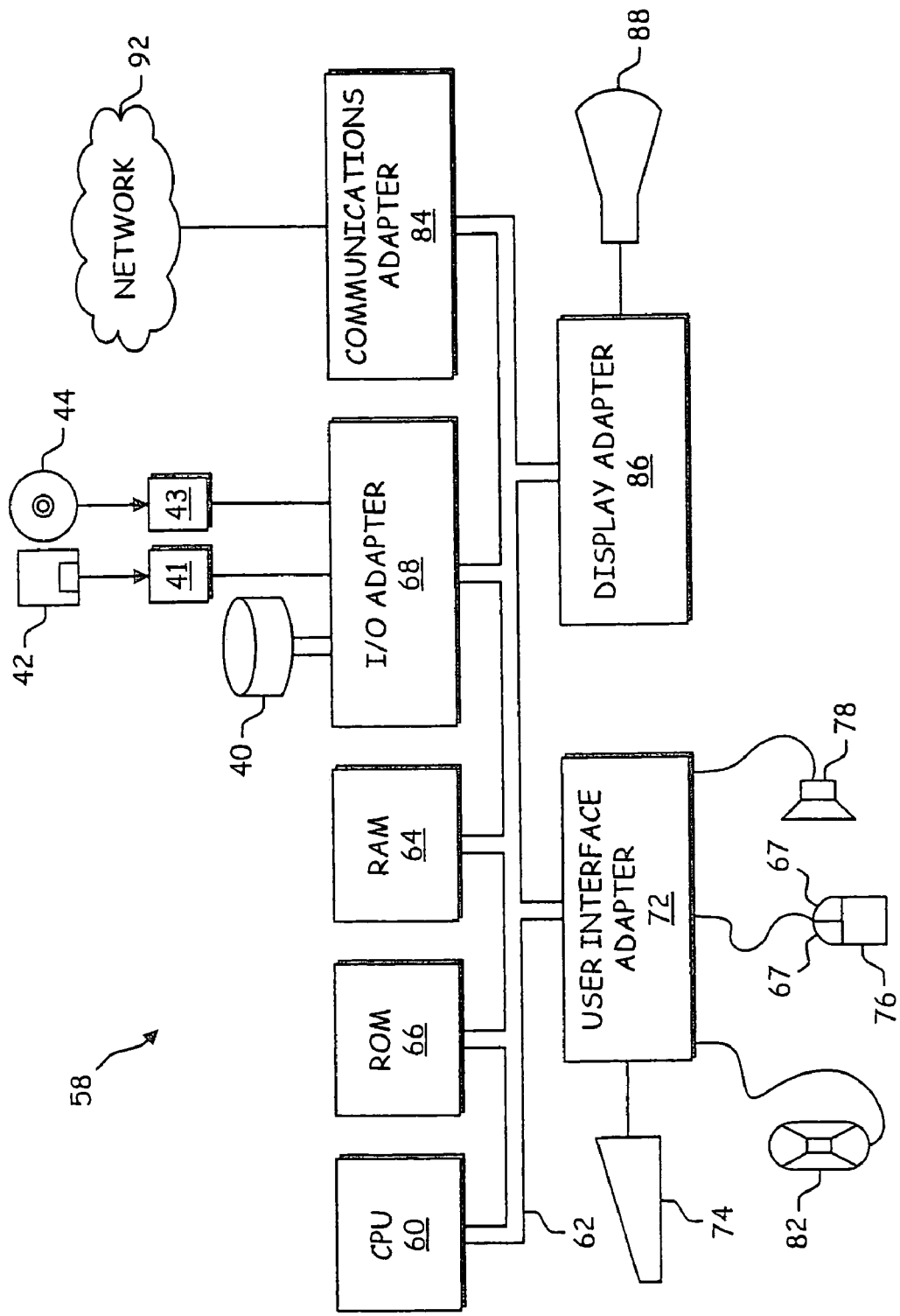
FIG. 6 is a block diagram of an exemplary hardware environment wherein the present invention can be practiced.

Referring now to FIG. 6, a representative hardware environment for a computer system 58 for practicing the present invention is depicted. A CPU 60 is interconnected via system bus 62 to random access memory (RAM) 64, read only memory (ROM) 66, an input/output (I/O) adapter 68, a user interface adapter 72, a communications adapter 84, and a display adapter 86. The input/output (I/O) adapter 68 connects peripheral devices such as hard disc drives 40, floppy disc drives 41 for reading removable floppy discs 42, and optical disc drives 43 for reading removable optical disc 44 (such as a compact disc or a digital versatile disc) to the bus 62. The user interface adapter 72 connects devices such as a keyboard 74, a mouse 76 having a plurality of buttons 67, a speaker 78, a microphone 82, and/or other user interfaces devices such as a touch screen device (not shown) to the bus 62. The communications adapter 84 connects the computer system to a data processing network 92. The display adapter 86 connects a monitor 88 to the bus 62.

An embodiment of the present invention can be implemented as a file resident in the random access memory 64 of one or more computer systems 58 configured generally as described in FIG. 6. Until required by the computer system 58, the file may be stored in another computer readable memory, for example in a hard disc drive 40, or in removable memory such as an optical disc 44 for eventual use in an optical disc drive 43, or a floppy disc 42 for eventual use in a floppy disc drive 41. The file can contain a plurality of instructions executable by the computer system, causing the computer system to perform various tasks, such effectuating the flow chart described in FIGS. 4 and 5.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor can be implemented as part of an ASIC device with various functions implemented as firmware.

Common compression standards such as a MPEG-2 utilize Huffman code for variable length coding. A decoder system can comprise memory packing Huffman codes as described herein. Additionally, the decoder system can decode the Huffman codes as described in FIG. 5.

Figure 7:
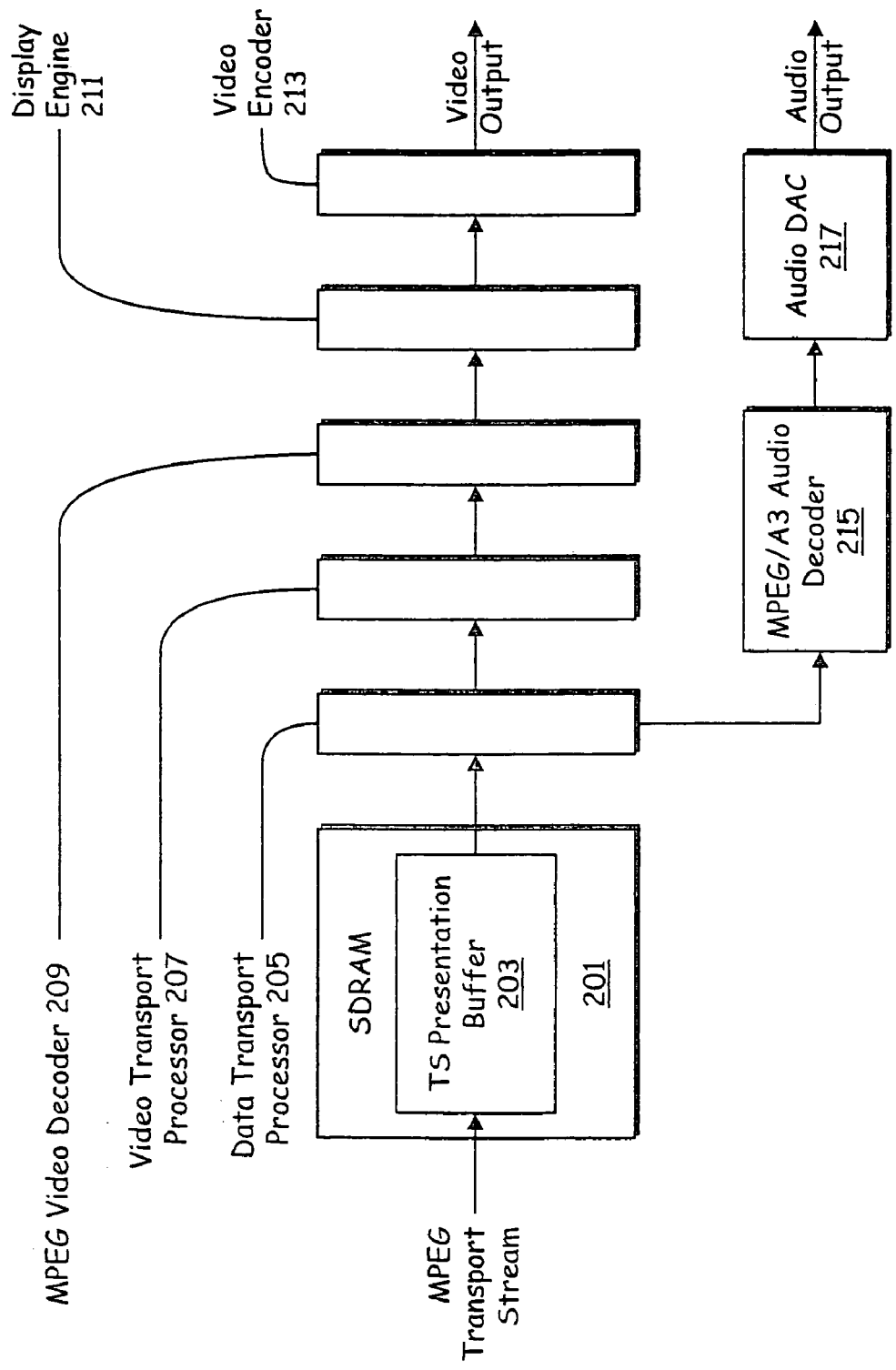
FIG. 7 is a block diagram of a decoder system in accordance with an embodiment of the present invention.

Referring now to FIG. 7, there is illustrated a block diagram of an exemplary decoder for decoding compressed video data, configured in accordance with an embodiment of the present invention. A processor, that may include a CPU, reads a stream of transport packets (a transport stream) into a transport stream buffer 203 within an SDRAM 201. The data is output from the transport stream presentation buffer 203 and is then passed to a data transport processor 205. The data transport processor then demultiplexes the MPEG transport stream into its PES constituents and passes the audio transport stream to an audio decoder 215 and the video transport stream to a video transport processor 207. The video transport processor 207 converts the video transport stream into a video elementary stream and provides the video elementary stream to an MPEG video decoder 209 that decodes the video.

The audio data is sent to the output blocks and the video is sent to a display engine 211. The display engine 211 is responsible for and operable to scale the video picture, render the graphics, and construct the complete display among other functions. Once the display is ready to be presented, it is passed to a video encoder 213 where it is converted to analog video using an internal digital to analog converter (DAC). The digital audio is converted to analog in the audio digital to analog converter (DAC) 217.

Figure 8:
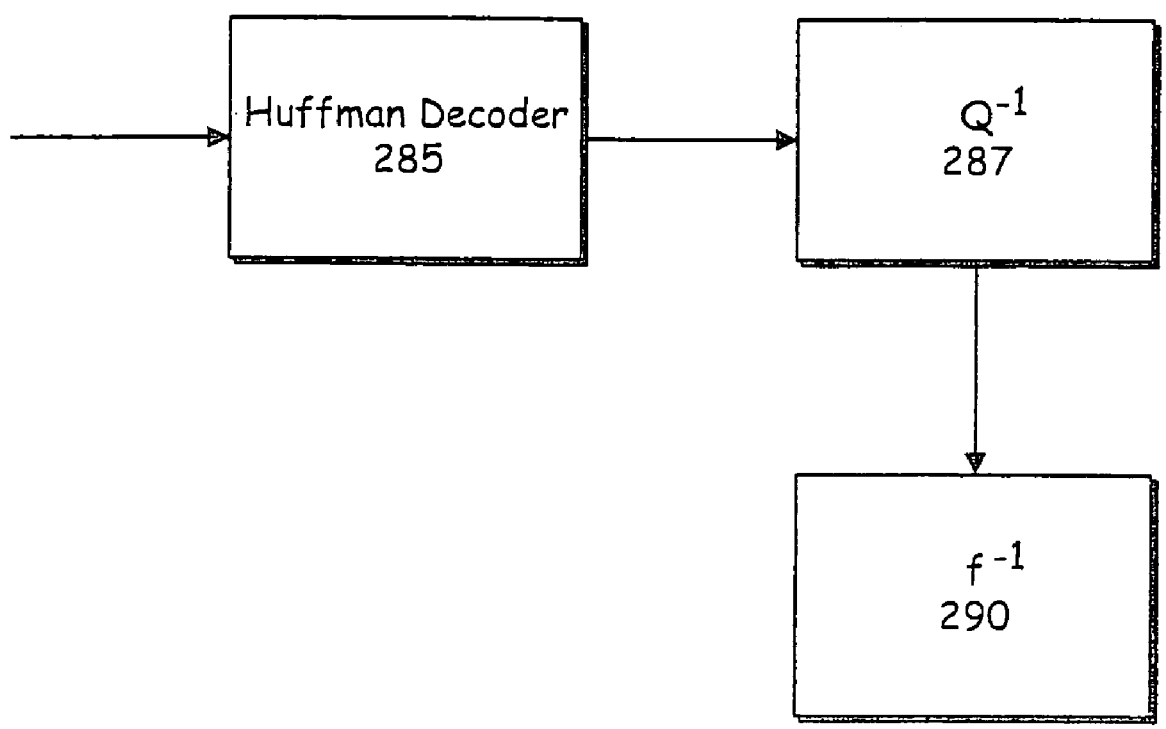
FIG. 8 is a block diagram of an audio/video decoder in accordance with an embodiment of the present invention.

Referring now to FIG. 8, there is illustrated a block diagram describing an audio decoder 215 or video decoder 209 in accordance with an embodiment of the present invention. The audio decoder or video decoder comprises a Huffman Decoder 285, an inverse quantizer 287, and an inverse frequency domain converter 290. The inverse frequency domain converter 290 converts frequency domain samples to either the spatial domain or the time domain.

In the case of a video decoder 209, the inverse frequency domain converter 290 comprises an inverse discrete cosine transformation block and converts frequency domain samples to the spatial domain. In the case of an audio decoder 215, the inverse frequency domain converter 290 comprises an inverse modified discrete cosine transformation block and converts frequency domain samples to the time domain.

The elementary stream is received by the Huffman Decoder 285. The Huffman Decoder 285 decodes Huffman coded symbols in the elementary stream. The inverse quantizer 290 dequantizes frequency domain coefficients in the elementary stream. The inverse frequency domain converter block 290 converts the frequency domain coefficients to either the spatial or time domain.

The Huffman decoder 285 can comprise memory that packs Huffman codes as described herein. Additionally, the Huffman decoder 285 can effectuate the flow chart described in FIG. 5 to decode Huffman codes. When the Huffman decoder 285 finds a symbol for a code word, the symbol can be used to calculate spectral values. If the Huffman table is an unsigned table, then the next bits in the stream are read from the bit stream as sign bits. Alternatively, if an escape symbol is found, a pulse data spectral coefficient is calculated and then the search is directed back until all of the spectral coefficients for the present frame are computed.

For decoding any Huffman table, a multi-stage lookup with a different number of bits looked up at each stage is done. This gives an advantageous tradeoff between the total memory requirement and the worst case cycle counts for decoding any Huffman code. Assuming a 32-bit register contains a value for the starting address of the table lookup and initial lookup size, the bit interpretation can be as show in the table.

| 31 | 4 3 | 0 |
|---|---|---|
| Starting address of the Huffman table (28 bits) | Initial look up size (4 bits) | |

The magnitude of all data fields, signs for all the data fields (wherever applicable), Huffman code length, next stage lookup address or next stage size can be stored in a 16-bit word as described below.

Huffman Tables Packing for MPEG-1 Layer-3 Audio Decoder

| 15 | 2 1 | 0 |
|---|---|---|
| | Search status (2 bits) | |

The interpretation of bits from 2 to 15 can be dependent on the value of bits 0 and 1. To decode a Huffman code, the four least significant bits in the 32-bit register indicate how many bits from the data stream are extracted for Huffman decoding. The contents of the memory location in the memory packing a binary tree that corresponds to the extracted bits can then be examined. If the value of bits 1 and 0 is 00, then there is an error in the Huffman stream and the decoder system takes appropriate actions.

If the value of search status (bits 1 and 0) is 10, it is a valid Huffman code and interpretation of the bits from 2 to 15 are given below for each lookup table. On decoding the Huffman code, the length of the Huffman code is returned back and the pointer is set appropriately to extract the appropriate number of bits for decoding the next Huffman code.

| 15 | 11 | 10 9 | 6 5 | 2 |
|---|---|---|---|---|
| Symbol length (5 bits) | Not used | Y value (4 bits) | Z value (4 bits) | |

The interpretation for special tables 33 and tables 34 (Dimension 4) used in MPEG-1 Layer 3 decoder is as follows:

| 15 | 11 10 | 6 | 5 | 4 | 3 | 2 |
|---|---|---|---|---|---|---|
| Symbol length (5 bits) | Not used | W (1 bit) | X (1 bit) | Y (1 bit) | Z (1 bit) | |

If the value of search status is 01, then it is an intermediate link and interpretation of the bits from 2 to 15 is as follows:

| 15 | 6 5 | 2 |
|---|---|---|
| Absolute address of the next table lookup (10 bits) | Next table Lookup size (4 bits) | |

Huffman Tables Packing for MPEG-2 AAC Audio Decoder

| 15 | 1 | 0 |
|---|---|---|
| | Search status (1 bit) | |

To decode a Huffman code, the four least significant bits in the 32-bit register indicate how many bits from the data stream are extracted for Huffman decoding. The contents of the memory location in the memory packing a binary tree that corresponds to the extracted bits can then be examined.

If the value of bit 0 is 0, then it is a code or error. To distinguish between an error or a code, the corresponding Huffman code length value is decoded. If the value of the code length is larger, that is not defined at all in the standard Huffman table, then an error is returned and a appropriate action is taken by the decoder. Otherwise, the interpretation of the bits from 1 to 15 are given below for each Huffman table. On decoding the Huffman code, the length of the Huffman code is returned back and pointer is set appropriately to extract the appropriate number of bits for decoding the next Huffman code.

MPEG-2-AAC Huffman table 1 and 2:

| 15 11 | 10 | 9 | 8 | 7 | 6 | 5 | 4 | 3 | 2 1 |
|---|---|---|---|---|---|---|---|---|---|
| Symbol length (5 bits) | Sign W (1 bit) | Sign X (1 bit) | Sign Y (1 bit) | Sign Z (1 bit) | W value (1 bit) | X value (1 bit) | Y value (1 bit) | Z value (1 bit) | Not used (2 bits) |

For MPEG-2-AAC Huffman table 3 and 4:

| 15 11 | 10 | 9 | 8 | 7 | 6 | 5 | 4 | 3 | 2 1 |
|---|---|---|---|---|---|---|---|---|---|
| Symbol length (5 bits) | Sign W (1 bit) | Sign X (1 bit) | Sign Y (1 bit) | Sign Z (1 bit) | W value (1 bit) | X value (1 bit) | Y value (1 bit) | Z value (1 bit) | Not used (2 bits) |

For MPEG-2-AAC Huffman table 5 and 6:

| 15 11 | 10 | 9 | 8 6 | 5 3 | 2 1 |
|---|---|---|---|---|---|
| Symbol length (5 bits) | Sign Y (1 bit) | Sign Z (1 bit) | Y value (3 bits) | Z value (3 bits) | Not used (2 bits) |

For MPEG-2-AAC Huffman table 7 through 11:

| 15 11 | 10 6 | 5 1 |
|---|---|---|
| Symbol length (5 bits) | Y value (5 bits) | Z value (5 bits) |

For Huffman Scale Factor Table:

| 15 11 | 10 1 |
|---|---|
| Symbol length (5 bits) | Scale factor value (10 bits) |

If the value of the search status (i.e., bit 0) is 1, then it is an intermediate link and the interpretation of the bits from 1 to 15 is given below:

| 15 5 | 4 1 |
|---|---|
| Relative address of the next table lookup (11 bits) | Next table Lookup size (4 bits) |

While the invention has been described with reference to certain embodiments, it will be understood by those skilled in the art that various changes may be made and equivalents may be substituted without departing from the scope of the invention. In addition, many modifications may be made to adapt particular situation or material to the teachings of the invention without departing from its scope. Therefore, it is intended that the invention not be limited to the particular embodiment(s) disclosed, but that the invention will include all embodiments falling within the scope of the appended claims.

The invention claimed is:

1. A method for storing a variable length code table in a memory, said method comprising:

(a) calculating a value for each of at least one levels of a binary tree;
(b) comparing the value for each of the at least one levels of the binary tree to a threshold; and
(c) generating at least one new binary tree from a particular one of the at least one levels, if the threshold exceeds the value for the particular one of the at least one levels.

2. The method of claim 1, further comprising:
performing (a)–(c) for each new binary tree generated during (c).

3. The method of claim 1, further comprising:
(d) associating a memory location for each possible bit combination for the particular one of the at least one levels.

4. The method of claim 3, further comprising:
performing (a)–(d) for each new binary tree generated during (c).

5. The method of claim 2, further comprising:
(e) storing a particular one of a plurality of symbols in each memory location associated with a bit combination associated with a data path along the binary tree that leads to the particular one of the plurality of symbols.

6. The method of claim 5, further comprising:
(f) storing a link to a particular one of the at least one new binary tree in each memory location associated with a bit combination associated with a data path along the binary tree that leads to the particular one of the at least one of the new binary trees.

7. The method of claim 6, further comprising:
performing (a)–(f) for each new binary generated during (c).

8. The method of claim 6, further comprising:
(g) storing a particular one of the plurality of symbols in each memory location associated with a bit combination, wherein the particular one of the plurality of symbols matches a prefix of the bit combination.

9. The method of claim 8, further comprising:

performing (a)–(g) for each new binary generated during (c).

10. An article of manufacture comprising a computer readable medium, wherein the computer readable medium stores a plurality of instructions, wherein execution of the plurality of instructions causes:

(a) calculating a value for each of at least one levels of a binary tree;

(b) comparing the value for each of the at least one levels of the binary tree to a threshold; and (c) generating at least one new binary tree from a particular one of the at least one levels, if the threshold exceeds the value for the particular one of the at least one levels.

11. The article of manufacture of claim 10, wherein execution of the plurality of instructions also causes:

performing (a)–(c) for each new binary tree generated during (c).

12. The article of manufacture of claim 10, wherein execution of the plurality of instructions also causes:

(d) associating a memory location for each possible bit combination for the particular one of the at least one levels.

13. The article of manufacture of claim 12, wherein execution of the plurality of instructions also causes:

performing (a)–(d) for each new binary tree generated during (c).

14. The article of manufacture of claim 12, wherein execution of the plurality of instructions also causes:

(e) storing a particular one of a plurality of symbols in each memory location associated with a bit combination associated with a data path along the binary tree that leads to the particular one of the plurality of symbols.

15. The article of manufacture of claim 14, wherein execution of the plurality of instructions also causes:

(f) storing a link to a particular one of the at least one new binary tree in each memory location associated with a bit combination associated with a data path along the binary tree that leads to the particular one of the at least one of the new binary trees.

16. The article of manufacture of claim 15, wherein execution of the plurality of instructions also causes:

performing (a)–(f) for each new binary generated during (c).

17. The article of manufacture of claim 15, wherein execution of the plurality of instructions also causes:

(g) storing a particular one of the plurality of symbols in each memory location associated with a bit combination, wherein the particular one of the plurality of symbols matches a prefix of the bit combination.

18. The article of manufacture of claim 17, wherein execution of the plurality of instructions also causes:

performing (a)–(g) for each new binary generated during (c).

* * * * *